United States Patent …

(12) United States Patent
Sakaguchi et al.

(10) Patent No.: US 11,408,429 B2
(45) Date of Patent: Aug. 9, 2022

(54) VACUUM PUMP APPARATUS, AND PUMP MAIN BODY UNIT, CONTROL UNIT, AND SPACER EACH FOR USE IN VACUUM PUMP APPARATUS

(71) Applicant: Edwards Japan Limited, Chiba (JP)

(72) Inventors: Yoshiyuki Sakaguchi, Chiba (JP); Yanbin Sun, Chiba (JP); Kengo Saegusa, Chiba (JP); Hideki Omori, Chiba (JP)

(73) Assignee: Edwards Japan Limited, Chiba (JP)

( * ) Notice: Subject to any disclaimer, the term of this patent is extended or adjusted under 35 U.S.C. 154(b) by 206 days.

(21) Appl. No.: 16/477,745

(22) PCT Filed: Jan. 12, 2018

(86) PCT No.: PCT/JP2018/000698
§ 371 (c)(1),
(2) Date: Jul. 12, 2019

(87) PCT Pub. No.: WO2018/135412
PCT Pub. Date: Jul. 26, 2018

(65) Prior Publication Data
US 2020/0124043 A1    Apr. 23, 2020

(30) Foreign Application Priority Data

Jan. 20, 2017 (JP) .............................. JP2017-008275

(51) Int. Cl.
*F04D 25/06* (2006.01)
*F04D 19/04* (2006.01)
(Continued)

(52) U.S. Cl.
CPC ............ *F04D 25/068* (2013.01); *F04B 37/14* (2013.01); *F04B 37/16* (2013.01); *F04B 39/00* (2013.01);
(Continued)

(58) Field of Classification Search
None
See application file for complete search history.

(56) References Cited

U.S. PATENT DOCUMENTS 6,398,524 B1    6/2002  Taira et al.
10,215,191 B2 *  2/2019  Omori ................... F04D 25/068
(Continued)

FOREIGN PATENT DOCUMENTS

CN      204554276      8/2015
EP      1036951 A1     9/2000
(Continued)

OTHER PUBLICATIONS

PCT International Search Report dated Apr. 24, 2018 for corresponding PCT Application No. PCT/JP2018/000698.
(Continued)

*Primary Examiner* — Charles G Freay
(74) *Attorney, Agent, or Firm* — Theodore M. Magee; Westman, Champlin & Koehler, P.A.

(57) ABSTRACT

Provided is a vacuum pump apparatus which allows reductions in thickness, weight, size, and cost of a vacuum pump control device. In the vacuum pump apparatus, a pump main body unit and a control unit which controls driving of the
(Continued)

pump main body unit are integrated with each other. The vacuum pump apparatus has a configuration in which a spacer configured to support a load applied to a housing of the control unit is provided between a base of the pump main body unit and the housing of the control unit.

7 Claims, 11 Drawing Sheets

(51) Int. Cl.
*H05K 5/02* (2006.01)
*F04B 37/14* (2006.01)
*F04B 39/00* (2006.01)
*F04B 37/16* (2006.01)
*F04D 29/64* (2006.01)
*F04D 29/52* (2006.01)

(52) U.S. Cl.
CPC ............ *F04D 19/04* (2013.01); *H05K 5/0204* (2013.01); *F04D 29/522* (2013.01); *F04D 29/644* (2013.01)

(56) References Cited

U.S. PATENT DOCUMENTS

| 2013/0209272 A1* | 8/2013 | Omori | F04D 29/5813 |
| | | | 417/26 |
| 2019/0277296 A1* | 9/2019 | Okada | H05K 7/14 |

FOREIGN PATENT DOCUMENTS

| JP | S6246898 | | 3/1987 |
| JP | H11173293 | A | 6/1999 |
| JP | 2000183552 | A | 6/2000 |
| JP | 2015061393 | A | 3/2015 |
| WO | WO 2008/096622 | A1 * | 8/2008 |
| WO | WO 2012/046495 | A1 * | 4/2012 |

OTHER PUBLICATIONS

PCT International Written Opinion dated Apr. 24, 2018 for corresponding PCT Application No. PCT/JP2018/000698.
Extended European Search Report for corresponding European Patent Application No. 18741548.4 dated Jun. 8, 2020.

* cited by examiner

VACUUM PUMP APPARATUS, AND PUMP MAIN BODY UNIT, CONTROL UNIT, AND SPACER EACH FOR USE IN VACUUM PUMP APPARATUS

CROSS-REFERENCE OF RELATED APPLICATION

This application is a Section 371 National Stage Application of International Application No. PCT/JP2018/000698, filed Jan. 12, 2018, which is incorporated by reference in its entirety and published as WO 2018/135412 A1 on Jul. 26, 2018 and which claims priority of Japanese Application No. 2017-08275, filed Jan. 20, 2017.

BACKGROUND

The present invention relates to a vacuum pump apparatus and to a pump main body unit, a control unit, and a spacer each for use in the vacuum pump apparatus, and particularly to a vacuum pump apparatus having a structure which allows reductions in thickness and size of a control unit integrated with a pump main body unit and to a pump main body unit, a control unit, and a spacer each for use in the vacuum pump apparatus.

Conventionally, a vacuum pump such as a turbo molecular pump has been known in which, in a casing having an inlet port and an outlet port, a rotor is rotated at a high speed to perform an exhaust process. In addition, a vacuum pump apparatus has also been known in which a vacuum pump control device (controller) which controls driving by a motor for rotating the rotor of a main body of the vacuum pump is electrically connected to the vacuum pump main body (see, e.g., Japanese Patent No. 3165857).

A vacuum apparatus which thus performs an exhaust process using a vacuum pump apparatus to maintain a vacuum state therein is used for, e.g., a semiconductor manufacturing apparatus, an electron microscopic apparatus, a surface analysis apparatus, a microfabrication apparatus, or the like. In general, such a vacuum apparatus has a configuration in which a vacuum pump main body and a vacuum pump control device are separately configured, and a cable connects the vacuum pump main body and the vacuum pump control device.

In the vacuum pump apparatus in which the vacuum pump main body and the vacuum pump control device are separately configured, when the vacuum pump main body and the vacuum pump control device are disposed at different positions on a floor surface, a large placement space is required. Accordingly, a method which disposes the vacuum pump main body and the vacuum pump control device in vertically stacked relation, i.e., a structure in which the vacuum pump main body is disposed over the vacuum pump control device or the like may also be used (see also Japanese Patent No. 3165857).

The discussion above is merely provided for general background information and is not intended to be used as an aid in determining the scope of the claimed subject matter. The claimed subject matter is not limited to implementations that solve any or all disadvantages noted in the background.

SUMMARY

However, in the structure in which the vacuum pump main body is disposed over the vacuum pump control device, when, e.g., the vacuum pump apparatus is transported or placed temporarily before disposed in such an apparatus as the semiconductor manufacturing apparatus mentioned above, an overall weight of the vacuum pump main body may be applied as a load to an upper surface of the vacuum pump control device. Accordingly, it is necessary to increase a strength of an upper surface of a casing (housing) in the vacuum pump control device as well as a strength of the entire vacuum pump control device. To thus increase the strength of the vacuum pump control device, it is necessary to increase not only a thickness of a top surface portion thereof, but also a thickness of the entire vacuum pump control device. It is also necessary to use a special material and thus increase the strength of the vacuum pump control device or the like. As a result, a size of the vacuum pump control apparatus or a weight thereof is increased to result in the problems of inconvenient handling and higher cost.

Thus, a technical problem arises to be solved to provide a vacuum pump apparatus which allows reductions in thickness, weight, size, and cost of a vacuum pump control device. An object of the present invention is to solve the problem.

The present invention is proposed to attain the object described above and the invention provides a vacuum pump apparatus in which a pump main body unit and a control unit which controls driving of the pump main body unit are integrated with each other, the apparatus including: a housing of the pump main body unit; a housing of the control unit; and a spacer disposed in the housing of the control unit to support a load applied to the housing of the control unit.

In this configuration, a weight of the pump main body unit is transmitted to the control unit through the spacer disposed between the housing of the pump main body unit and the housing of the control unit, and further transmitted to a ground contact surface such as a floor surface through the housing of the control unit. In other words, the weight of pump main body unit is controlled to be received once by the spacer. Accordingly, it is sufficient to increase only a strength of a portion of the housing of the control unit or the like which receives the weight through the spacer, i.e., only a strength of a portion thereof corresponding to the spacer without increasing a strength of the entire housing of the control unit. A portion of the housing of the control unit other than the portion thereof corresponding to the spacer is not required to have a particularly large strength. This can reduce the size and the weight of the entire control unit, which contributes to a cost reduction.

The invention provides the vacuum pump apparatus in which, in the configuration recited above, the spacer forms a predetermined gap between the pump main body unit and the control unit.

In this configuration, the spacer forms the predetermined gap between the pump main body unit and the control unit, and the weight of the pump main body unit is transmitted to the control unit through the spacer. Then, the weight is transmitted to the ground contact surface through a predetermined portion of the housing of the control unit. This allows the weight of the pump main body unit to be transmitted through the spacer, i.e., prevents the weight of the pump main body unit from being transmitted directly from the pump main body unit to the housing of the control unit. Consequently, it is possible to further reduce the strength of the housing of the control unit.

The invention provides the vacuum pump apparatus in which, in the configuration recited above, the spacer includes a plurality of the spacers which are provided upright in the housing of the control unit to be spaced apart from each other at a predetermined interval.

This configuration allows the weight of the pump main body unit to be dispersed to the plurality of spacers unit and then transmitted to the control unit. Accordingly, it is possible to further reduce the strength of the control unit by using smaller spacers.

The invention provides the vacuum pump apparatus in which, in the configuration recited above, the spacer is disposed laterally to the housing of the control unit.

This configuration allows the weight of the pump main body to be dispersed to the spacer disposed laterally to the housing of the control unit and then transmitted to the control unit.

The invention provides the vacuum pump apparatus in which the spacer is disposed in the housing of the control unit.

This configuration allows the weight of the pump main body unit to be dispersed to the spacer disposed in the housing of the control unit and then transmitted to the control unit.

The invention provides the vacuum pump apparatus in which on a bottom surface of the housing of the control unit, a leg portion capable of being grounded on a floor surface is provided to correspond to the spacer.

This configuration allows the weight of the pump main body unit transmitted to the control unit through the spacer to be further transmitted to the ground contact surface through the predetermined leg portion.

The invention provides the vacuum pump apparatus in which a lower end portion of the spacer is allowed to extend through the housing of the control unit and be grounded on a floor surface on which the vacuum pump apparatus is installed.

This configuration allows the weight of the pump main body unit transmitted to the control unit through the spacer to be transmitted directly from the spacer to the ground contact surface. This can further reduce the strength of the control unit and also further reduce the size and the weight of the control unit.

The invention provides the vacuum pump apparatus in which the housing of the control unit has a boss portion protruding from the bottom surface of the housing of the control unit toward a top surface of the housing of the control unit, the boss portion being provided in opposing relation to at least one of the spacers to be capable of coming into contact therewith.

In this configuration, the weight of the pump main body unit is transmitted to the ground contact surface through each of the boss portion protruding from the bottom surface of the housing toward the top surface thereof and the spacer opposing and in contact with the boss portion. This can further reduce the strength of the control unit.

The invention provides a vacuum pump unit for use in the vacuum pump apparatus.

This configuration allows the vacuum pump unit which allows reductions in thickness, weight, size, and cost of the vacuum pump control apparatus to be obtained.

The invention provides a control unit for use in the vacuum pump apparatus.

This configuration allows the vacuum pump unit which allows reductions in thickness, weight, size, and cost of the vacuum pump control apparatus to be obtained.

The invention provides a spacer for use in the vacuum pump apparatus.

This configuration allows the spacer which allows reductions in thickness, weight, size, and cost of the vacuum pump control apparatus to be obtained.

According to the present invention, the weight of the pump main body unit is controlled to be transmitted to the control unit through the spacer disposed between the housing of the pump main body unit and the housing of the control unit and then transmitted to the ground contact surface through the housing of the control unit. Accordingly, it is sufficient to increase only the strength of the portion of the housing of the control unit or the like corresponding to the spacer without increasing the strength of the entire housing of the control unit. In other words, the portion of the housing of the control unit other than the portion thereof corresponding to the spacer is not required to have a particularly large strength. This can reduce the size and the weight of the pump main body unit, which contributes to a cost reduction.

The Summary is provided to introduce a selection of concepts in a simplified form that are further described in the Detail Description. This summary is not intended to identify key features or essential features of the claimed subject matter, nor is it intended to be used as an aid in determining the scope of the claimed subject matter.

DESCRIPTION OF THE PREFERRED EMBODIMENTS

Figure 1:
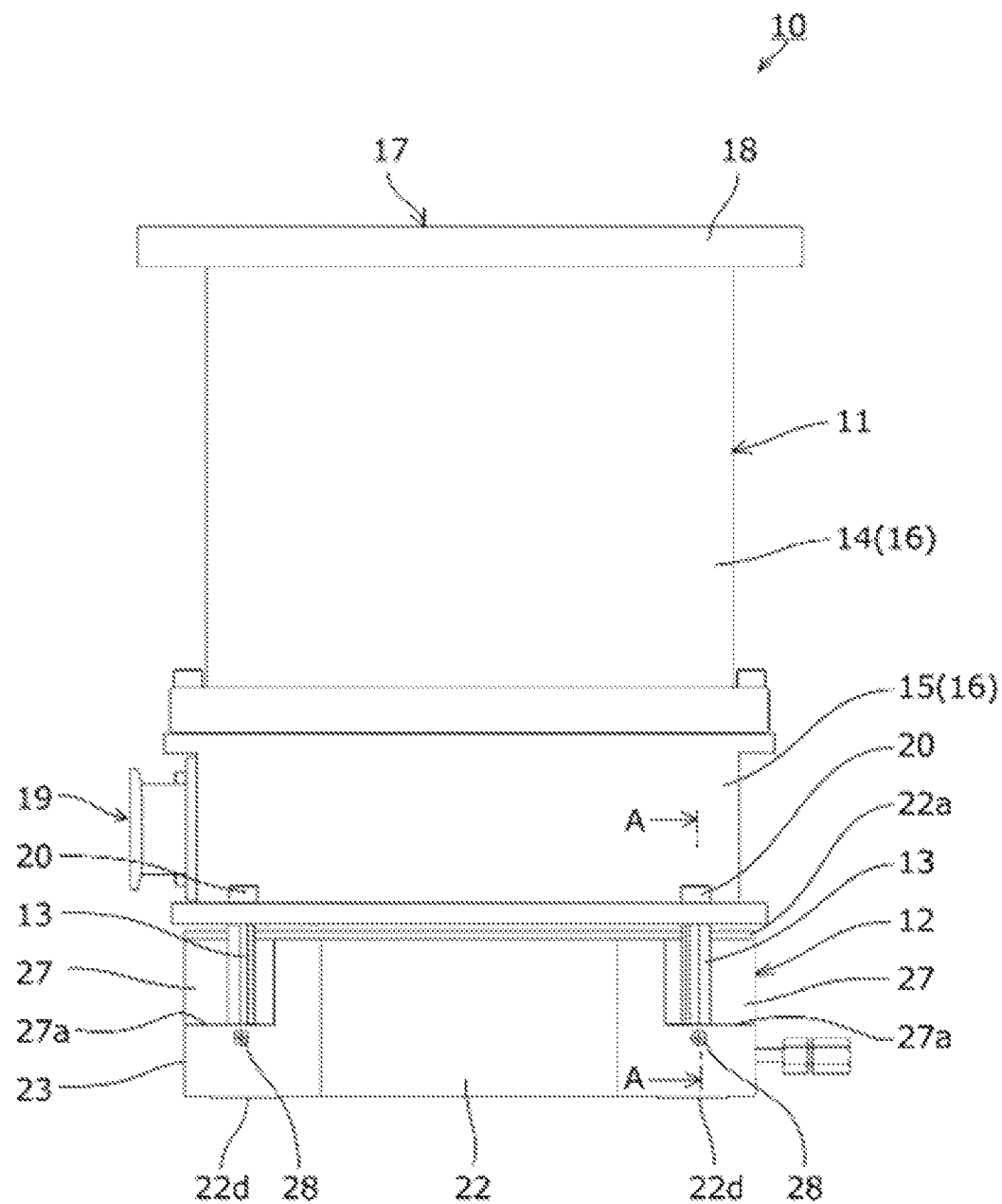
FIG. 1 is side view of a vacuum pump apparatus based on a first embodiment of the present invention.

To attain the object of providing a vacuum pump apparatus which allows reductions in thickness, weight, size, and cost of a vacuum pump control device, the present invention implements the vacuum pump apparatus as a configuration in which a pump main body unit and a control unit which controls driving of the vacuum pump main body unit are integrated with each other. The configuration includes a housing of the pump main body unit, a housing of the control unit, and a spacer disposed in the housing of the control unit to support the pump main body unit.

The following will describe modes (hereinafter referred to as "embodiments") for carrying out the present invention in detail on the basis of accompanying drawings. Note that, in a description given below, throughout the entire description of each of the embodiments, like elements are given like reference numerals. Also, in the description given below, terms representing directions such as "upper", "lower", "left" and "right" are not absolute. Such terms are appropriate when used to express respective illustrated positions of the individual portions of the vacuum pump apparatus of the present invention. However, when the positions are changed, such terms should be construed as changeable in response to the changed positions.

Figure 2:
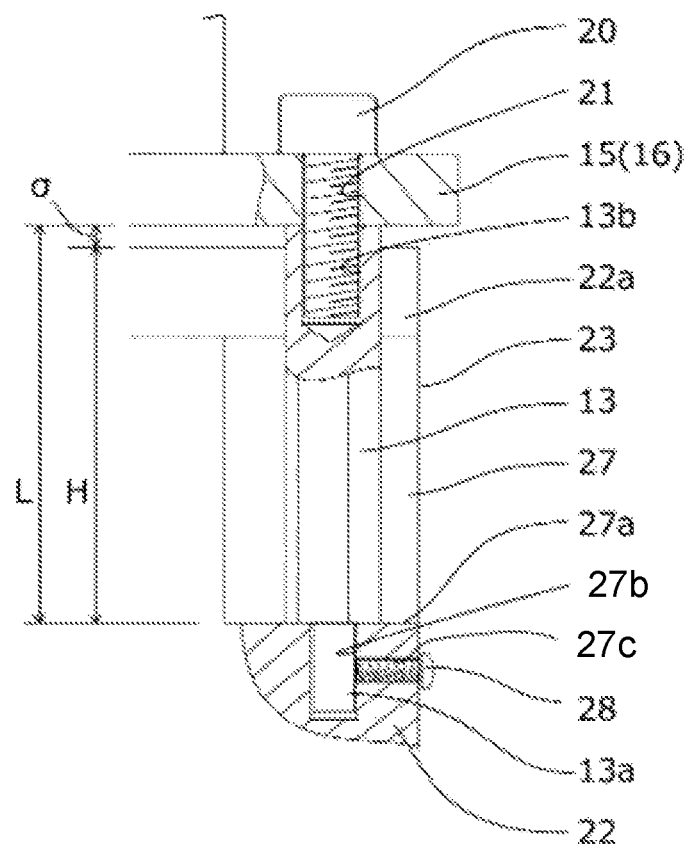
FIG. 2 is an enlarged schematic view taken along an arrow line A-A in FIG. 1 and showing a part of the vacuum pump apparatus in cut-away relation.
Figure 3:
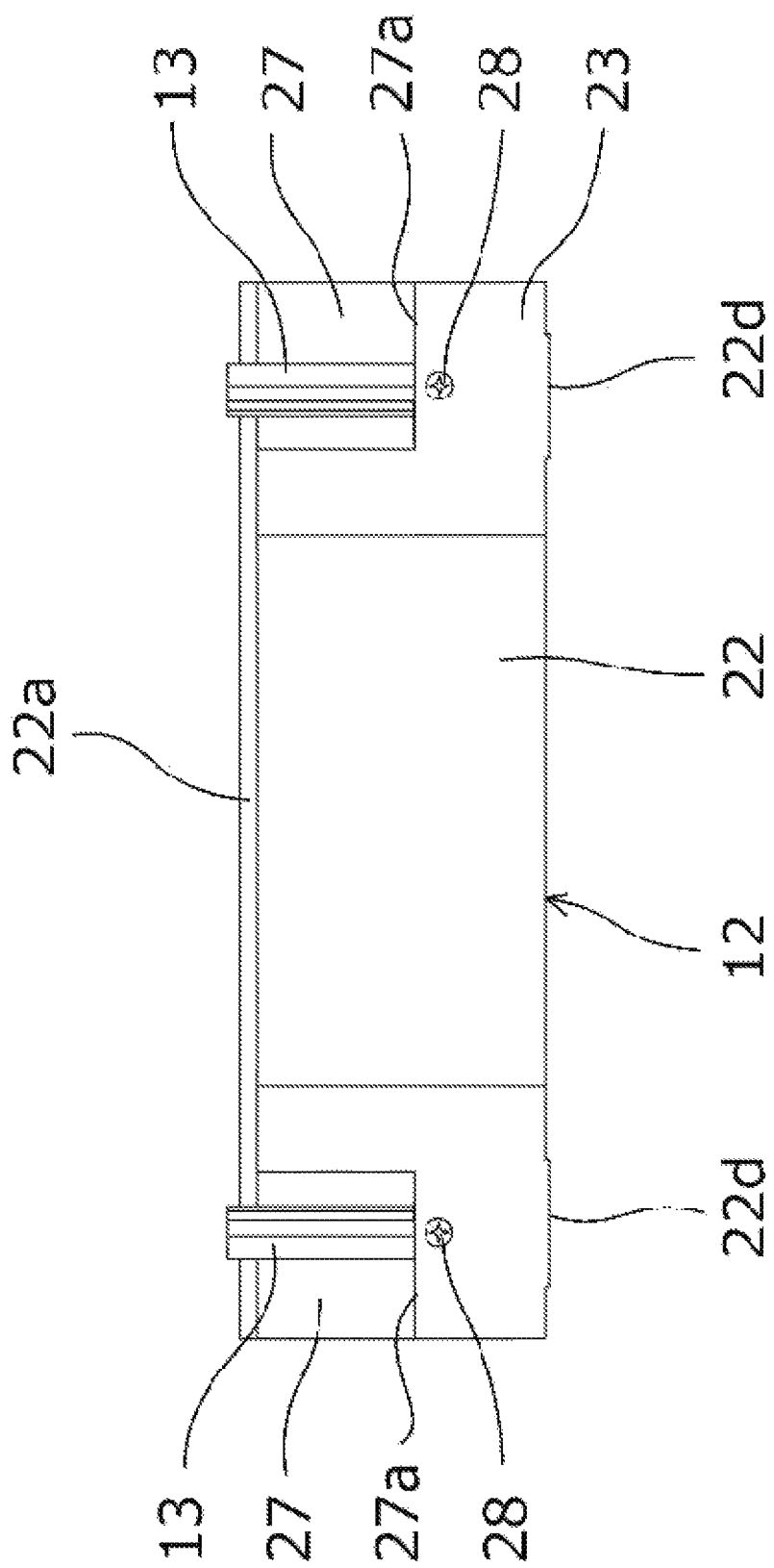
FIG. 3 is a side view of a control unit in the vacuum pump apparatus shown in FIG. 1.
Figure 4:
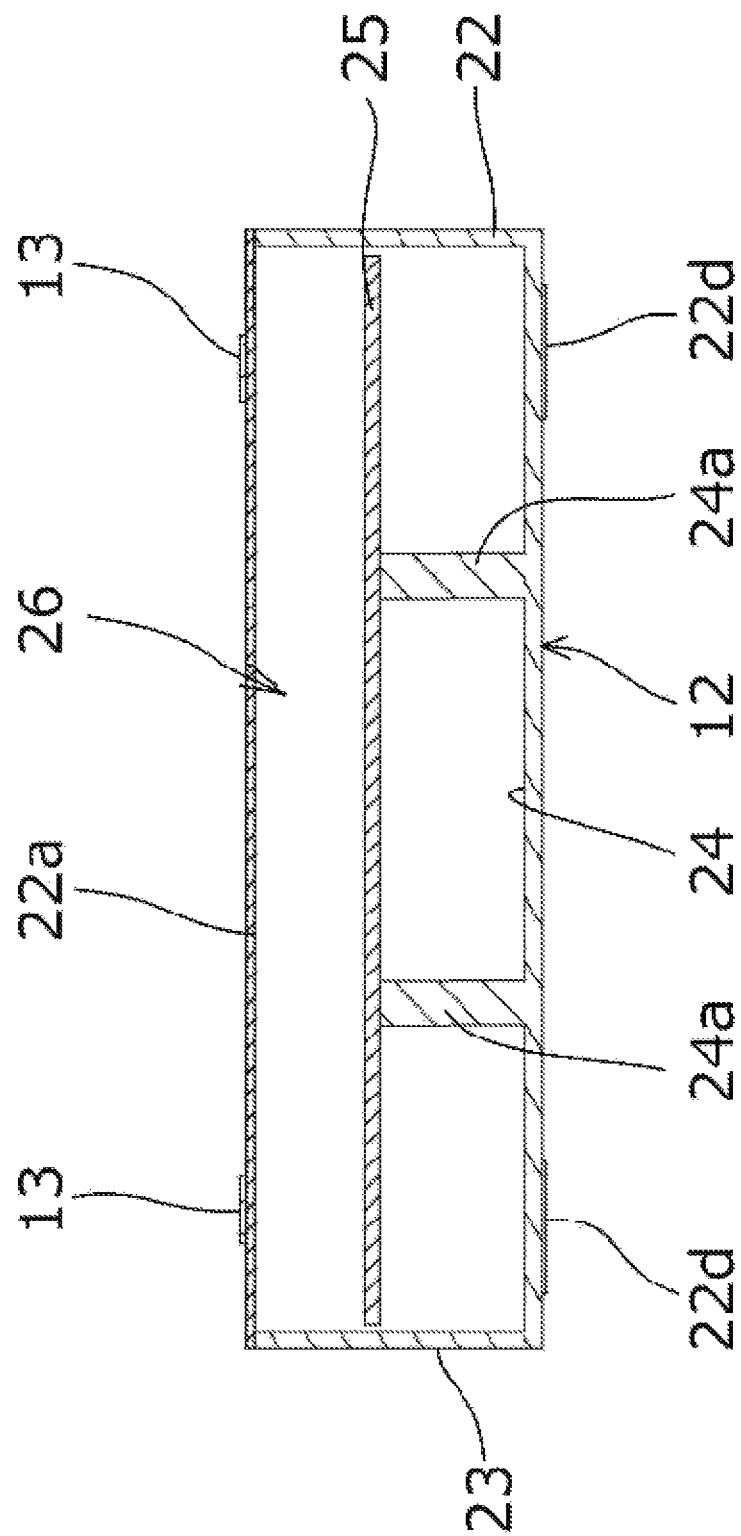
FIG. 4 is a vertical cross-sectional side view of the control unit shown in FIG. 3.
Figure 5:
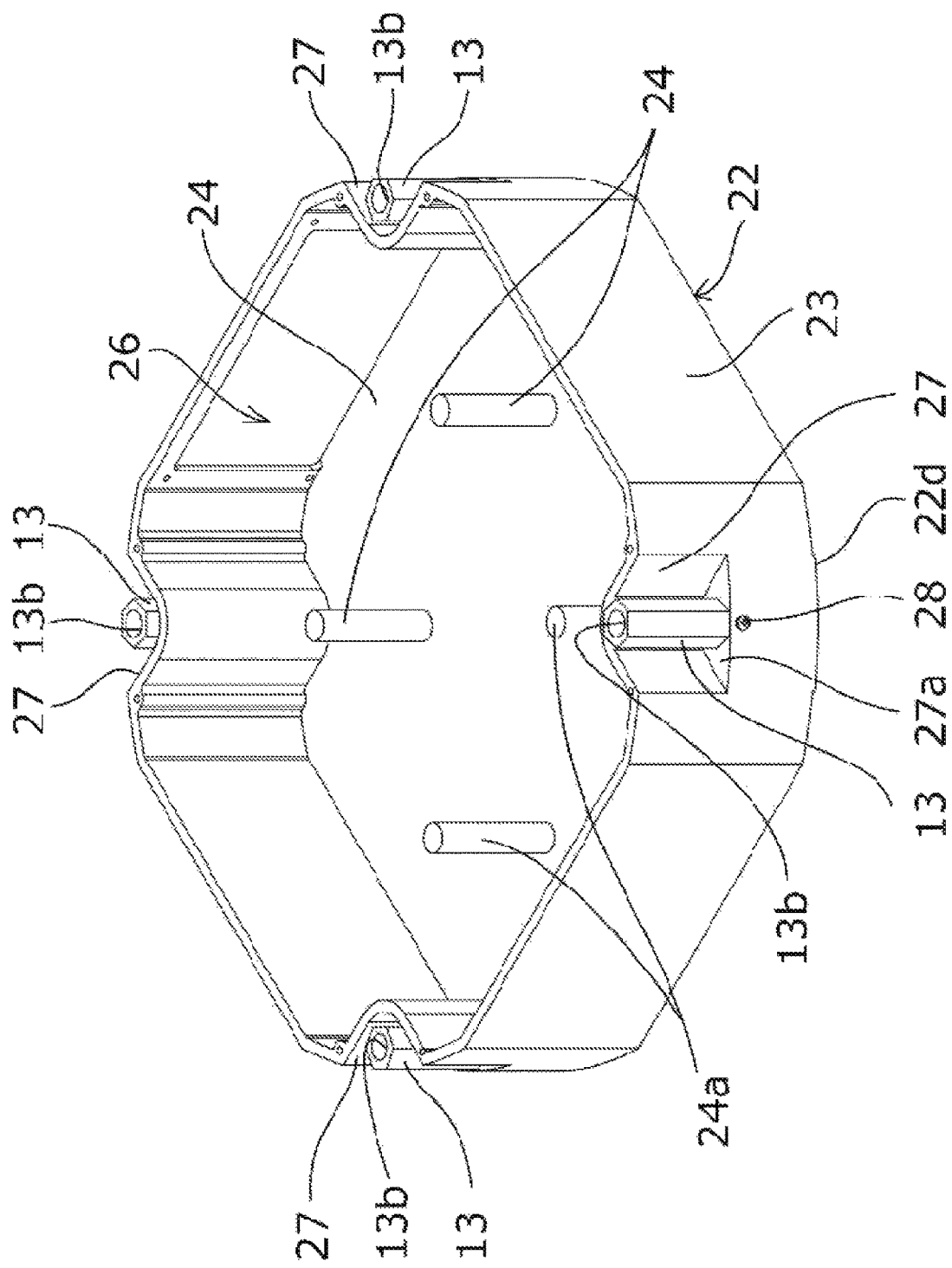
FIG. 5 is a main-portion perspective view of the control unit shown in FIG. 3.
Figure 6:
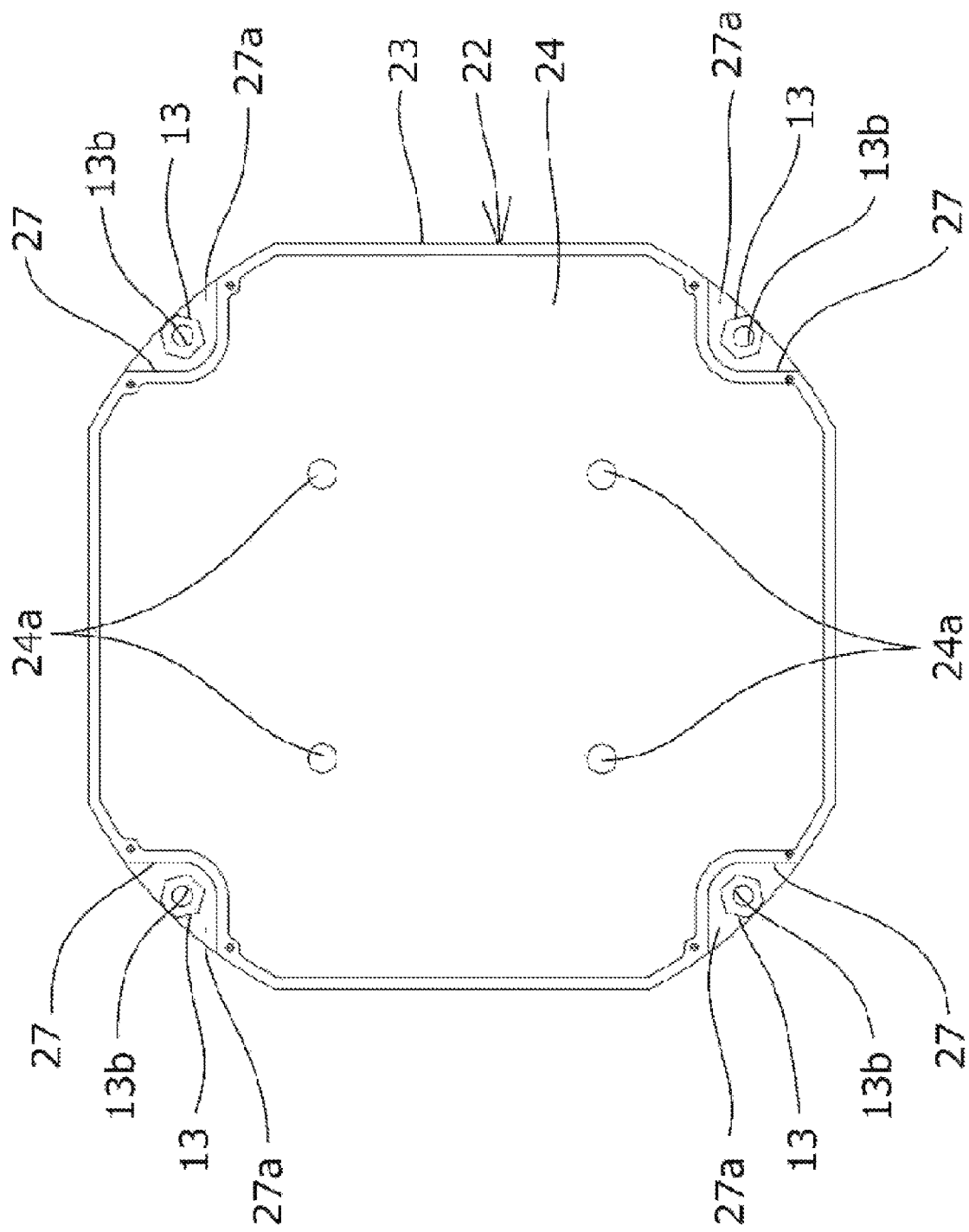
FIG. 6 is a plan view of a main portion of the control unit shown in FIG. 5.

FIGS. 1 through 6 show a vacuum pump apparatus 10 according to a first embodiment of the present invention. FIG. 1 is a side view of the vacuum pump apparatus 10. FIG. 2 is an enlarged schematic view taken along an arrow line A-A in FIG. 1 and showing a part of the vacuum pump apparatus 10 in cut-away relation. FIG. 3 is a side view of a control unit 12 in the vacuum pump apparatus 10. FIG. 4 is a vertical cross-sectional side view of the control unit 12 shown in FIG. 3. FIG. 5 is a main-portion perspective view of the control unit 12 shown in FIG. 3. FIG. 6 is a plan view of a main portion of the control unit 12 shown in FIG. 5.

In FIG. 1, the vacuum pump apparatus 10 includes a pump main body unit 11 and a control unit 12 which controls the pump main body unit 11. The vacuum pump apparatus 10 has a structure in which the pump main body unit 11 and the control unit 12 are integrated with each other via a plurality of spacers 13 (four spacers 13 in the first embodiment) which are interposed between the pump main body unit 11 and the control unit 12. Thus, the weight of the pump main body unit 11 is controlled to be transmitted to predetermined locations on the control unit 12, i.e., lower portions of the control unit 12 in which the spacers 13 are disposed through the spacers 13. Accordingly, in the control unit 12 of the vacuum pump apparatus 10, a strength of each of the portions to which the weight of the pump main body unit 11 is directly applied as a load, i.e., the respective portions in which the spacers 13 are disposed is increased, while the strength of the other portion is conversely reduced. By thus increasing a strength of the entire control unit 12, a size and a weight of the entire control unit 12 are reduced to achieve a cost reduction.

First, a description will be given of a structure of the pump main body unit 11. The pump main body unit 11 has a casing 14 forming a housing of the pump main body unit 11. The casing 14 has a substantially cylindrical shape to form, together with a base 15 provided under the casing 14, a housing 16 of the pump main body unit 11. Note that, in the housing 16 of the pump main body unit 11, a gas transfer mechanism as a structure which causes the pump main body unit 11 to perform an exhausting function is contained, though not shown in the drawing. The gas transfer mechanism basically includes a rotary portion which is rotatably supported and a stationary portion which is fixed with respect to the housing of the pump main body unit 11.

In an upper end portion of the casing 14, an inlet port 1'7 for introducing a gas into the pump main body unit 11 is formed. Around an end surface of the casing 14 closer to the inlet port 17, a radially outwardly protruding flange portion 18 is formed.

In the base 15, an outlet port 19 for exhausting the gas from the pump main body unit 11 is formed. Also, in the base 15, as shown in FIG. 2, at respective positions corresponding to the spacers 13, attachment holes 21 for attachment of bolts 20 are formed to allow the bolts 20 to be screwed into the base 15 to fasten together the base 15 and the spacer 13.

Next, a description will be given of a structure of the control unit 12. The control unit 12 has a housing 22 as a casing of the control unit 12. As shown in FIGS. 3 to 5, the housing 22 integrally has side surface portions 23 each having a substantially rectangular shape and a bottom surface portion 24 closing a lower end of the housing 22. The housing 22 has an upper surface having an opening (hereinafter referred to as the "upper surface opening") and a lower surface closed by the bottom surface portion 24, while having a space 26 provided therein. In the space 26, a circuit substrate 25 forming a control circuit which controls various operations of the pump main body unit 11 and the like are disposed. Note that the upper surface opening of the housing 22 is closed by a lid plate 22a to be openable/closable. In the first embodiment, each of the housing 22 and the lid plate 22a is made of die-cast aluminum.

In four respective corner portions of the side surface portions 23 of the housing 22, recessed portions 27 formed by inwardly notching the individual corner portions are provided. On the respective recessed portions 27, the spacers 13 are individually mounted upright. In respective bottom surfaces 27a of the individual recessed portions 27, as shown in FIG. 2, positioning holes 27b into which respective lower end protruding portions 13a of the spacers 13 are to be engagedly inserted are formed to position the spacers 13. In the side surface portions 23 corresponding to the positioning holes 27b, respective screw holes 27c formed to extend at right angles to the positioning holes 27b are provided to penetrate into the positioning holes 27b. Into the screw holes 27c, spacer fixing bolts 28 are fit to fix the lower end protruding portions 13a of the spacers 13 inserted in the positioning holes 27b. On a lower surface of the housing 22, leg portions 22d each having a projecting shape are provided to downwardly protrude from the lower surface of the housing 2:2 in correspondence to respective positions immediately below the portions of the housing 22 in which the individual recessed portions 27 are formed. Accordingly, it is not that the entire control unit 12 in the first embodiment is grounded on a floor surface, but that only the leg portions 22d are grounded on the floor surface.

Also, in the housing 22, on the bottom surface portion 24, pin-shaped boss portions 24a for positioning the substrate which are formed integrally with the bottom surface portion 24 are provided to vertically protrude from the bottom surface portion 24 toward the upper surface opening. Over the boss portions 24a for positioning the substrate, the circuit substrate 25 is placed as shown in FIG. 4 and fixed at a predetermined position in the space 26.

Each of the spacers 13 is formed as a rod-shape member having a hexagonal cross section. In the first embodiment, a stainless steel material is used to form the spacers 13. As shown in FIG. 2, in respective upper surfaces of the spacers 13, attachment screw holes 13h into which the bolts 20 for screw-fastening together the base 15 and the spacers 13 are to be screwed are formed. On the other hand, on respective lower surfaces of the spacers 13, the lower end protruding portions 13a mentioned above are integrally formed. Each of the spacers 13 is formed such that a length L thereof except for the lower end protruding portion 13a is slightly (by about 1 to 2 millimeters) larger than a height H from the bottom surface 27a of each of the recessed portions 27 of the housing 22 to an upper surface of the lid plate 22a to satisfy a relationship given by L>H.

When the vacuum pump apparatus 10 thus configured is used in a state where the pump main body unit 11 is placed over and integrated with the control unit 12, the vacuum pump apparatus 10 is assembled in accordance with a procedure as shown below in, e.g., (1) to (3).

(1) First, into the housing 22 of the control unit 12, the predetermined circuit substrate 25 is incorporated, and then the housing 22 is closed by the lid plate 22a. Subsequently, into the respective positioning holes 27b of the individual positioning recessed portions 27, the respective lower end protruding portions 13a of the corresponding spacers 13 are fit.

In addition, into the respective positioning holes 27b of the housing 22, the spacer fixing bolts 28 are individually screwed to fix and prevent the respective spacers 13 from falling off. As a result, each of the spacers 13 is disposed on the bottom surface 27a of the recessed portion 27 in fixed and upright relation thereto. FIGS. 2 and 3 show the resulting state.

(2) Then, over the control unit 12, the pump main body unit 11 is placed. In this case, the attachment holes 21 provided in the base 15 of the pump main body unit 11 are associated with the respective spacers 13 provided upright on the control unit 12, and the pump main body unit 11 is placed on the upper surfaces of the spacers 13. Consequently, the pump main body unit 11 is supported by the spacers 13 from below.

(3) As described above, each of the spacers 13 supporting the pump main body unit 11 from below is formed to have the length L which is slightly larger than the height H from the bottom surface 27a of each of the positioning recessed portions 27 of the housing 22 to the upper surface of the lid plate 22a. Accordingly, due to the dimensional difference, a predetermined gap n is formed between a bottom surface (lower surface) of the pump main body unit 11 and the upper surface of the lid plate 22a of the control unit 12. As a result, the pump main body unit 11 is not placed directly on the control unit 12.

Then, on the base 15 side of the pump main body unit 11, the bolts 20 are inserted into the attachment holes 21 to be screwed into the attachment screw holes 13b of the spacers 13 and tightened. As a result, the pump main body unit 11 and the control unit 12 are integrated with each other via the spacers 13. Subsequently, when the pump main body unit 11 and the control unit 12 are connected with an electric cable not shown, the assembly of the vacuum pump apparatus 10 is completed.

Consequently, in the vacuum pump apparatus 10 in the first embodiment thus configured, the weight of the pump main body unit 11 is transmitted to the control unit 12 through the spacers 13 disposed between the casing (housing) 14 of the pump main body unit 11 and the housing 22 of the control unit 12 and then further transmitted to a ground contact surface through the leg portions 22d of the control unit 12. Specifically, the weight of the pump main body unit 11 is controlled to be received once by the spacers 13, and then applied as a load from the spacers 13 to predetermined locations (bottom surfaces 27a of the recessed portions 27) on the control unit 12. Accordingly, it is sufficient to increase only the strength of each of the portions of the housing 22 of the control unit 12 or the like which correspond to the spacers 13, i.e., only the strength of each of the portions thereof located immediately under the recessed portions 27 and the leg portions 22d without increasing the strength of the entire housing 22. The portion of the housing 22 of the control unit 12 other than the portions thereof corresponding to the spacers 13 is not required to have a particularly large strength. This can reduce the size and the weight of the entire control unit 12, which contributes to a cost reduction.

The spacers 13 are formed of the plurality of rod-shaped spacers 13 (four spacers 13 in the first embodiment) each provided upright on an outer circumference in the housing 22 of the control unit 12, i.e., in the recessed portions 27 provided to be spaced apart from each other at predetermined intervals. This allows the weight of the pump main body unit 11 to be dispersed and then transmitted to the control unit 12 and consequently allows a further reduction in the strength of the control unit 12.

Note that the foregoing predetermined gap a provided between the bottom surface (lower surface) of the pump main body unit 11 and the upper surface of the lid plate 22a of the control unit 12 also functions to achieve a heat insulating effect between the pump main body unit 11 and the control unit 12. For example, when the pump main body unit 11 is at a temperature higher than that of the control unit 12, it is possible to reduce the probability that heat is transferred from the bottom surface (lower surface) of the pump main body unit 11 to the lid plate 22a of the control unit 12 and increases an inner temperature of the control unit 12.

Figure 7:
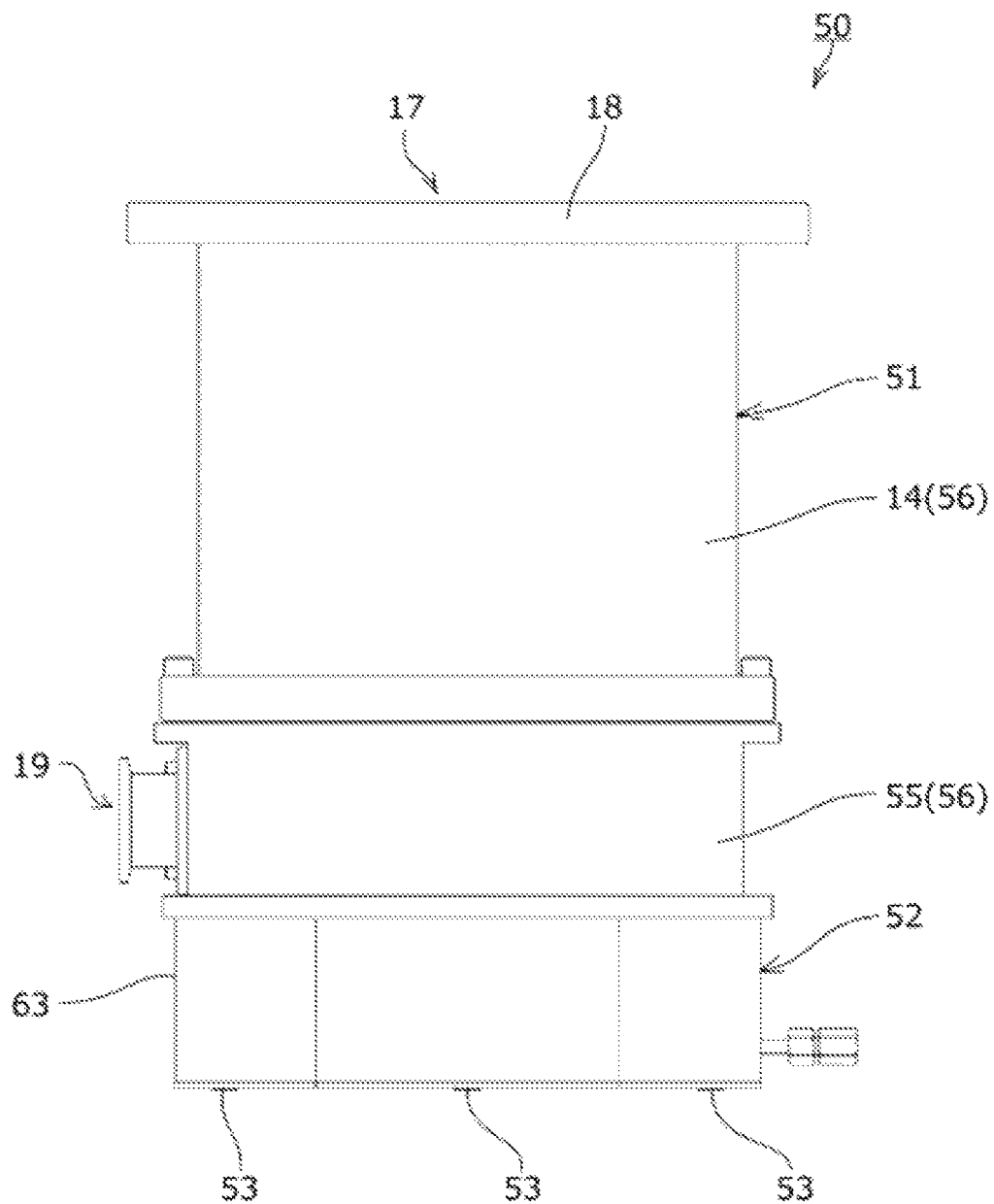
FIG. 7 is a side view of a vacuum pump apparatus based on a second embodiment of the present invention.
Figure 8:
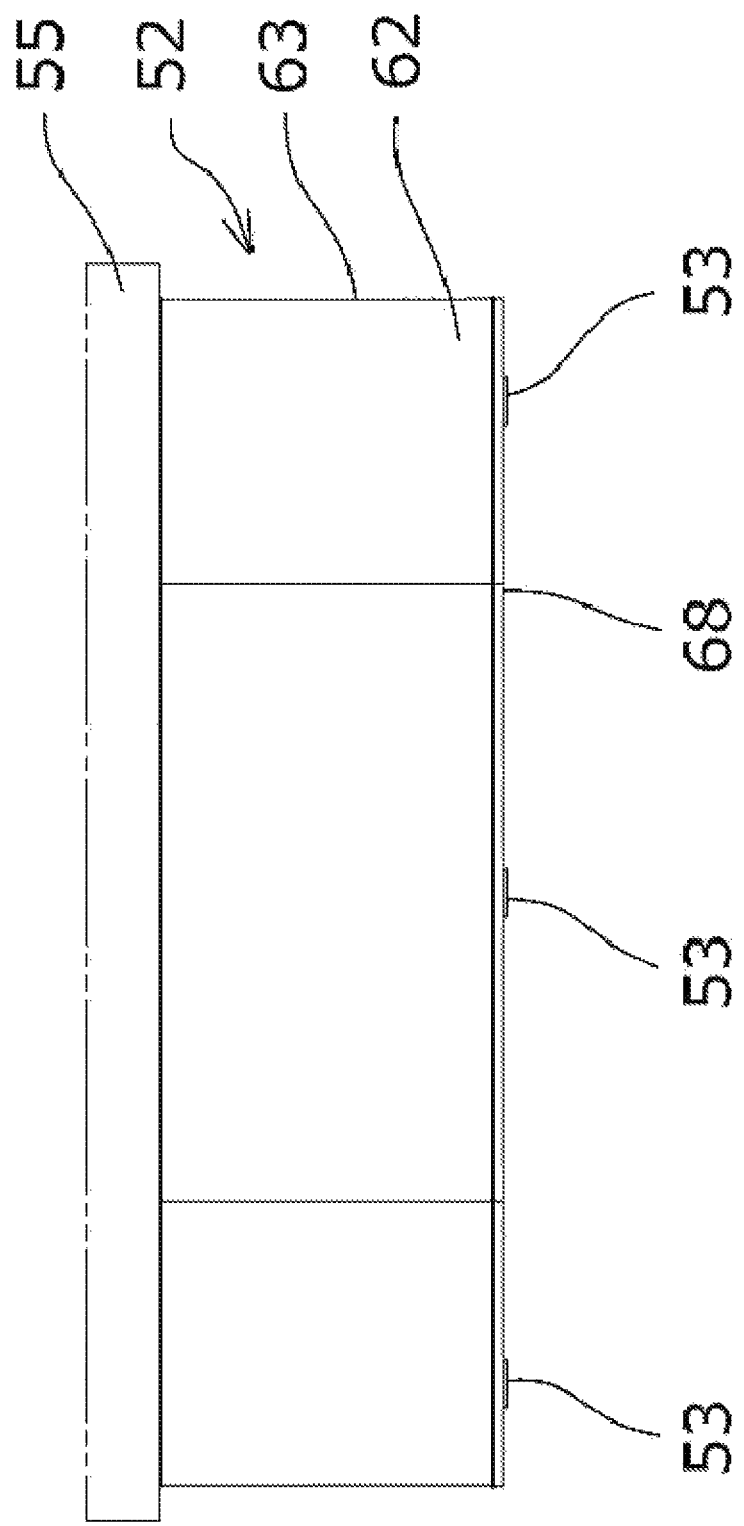
FIG. 8 is a side view of a control unit in the vacuum pump apparatus shown 7.
Figure 9:
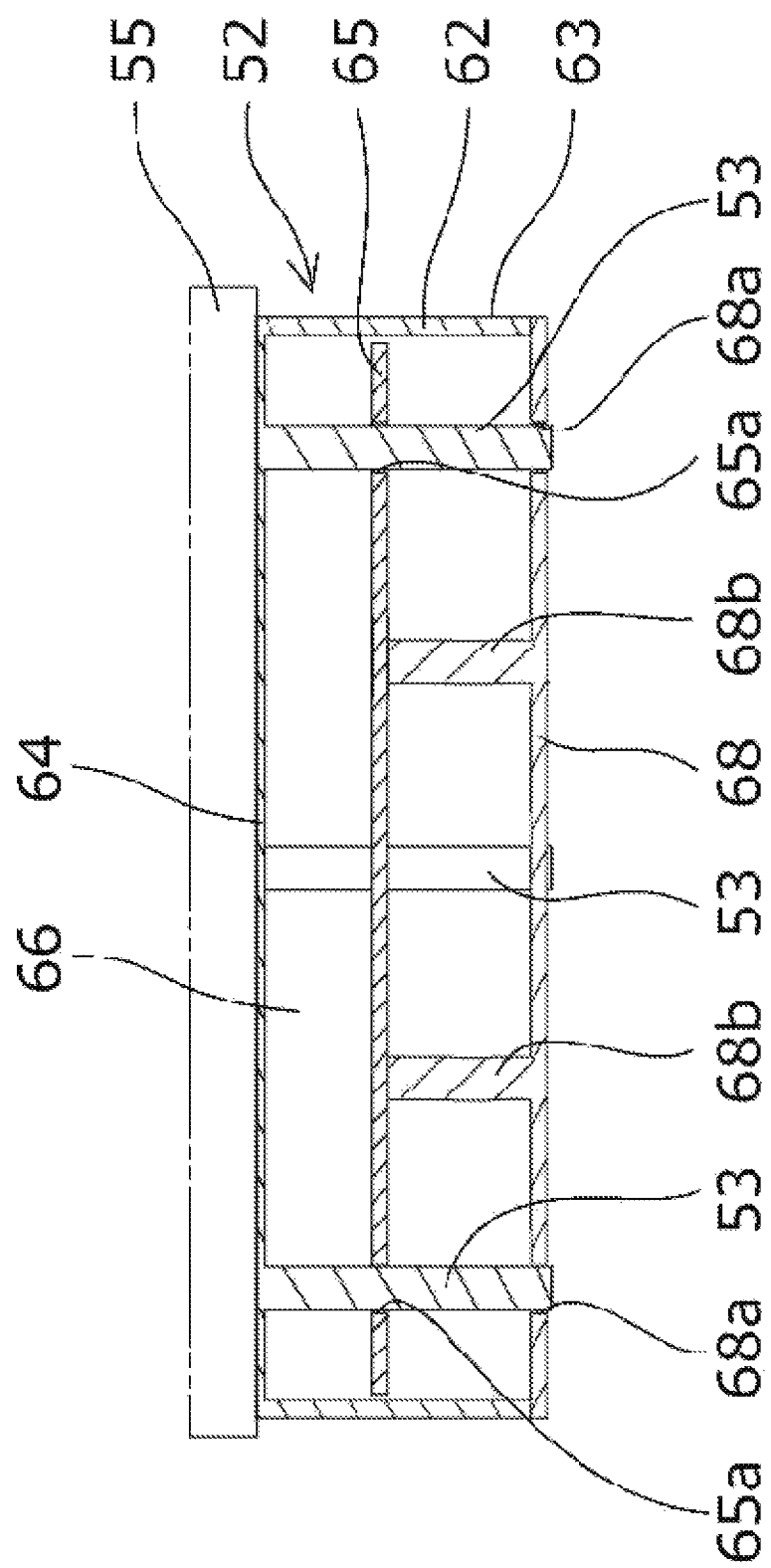
FIG. 9 is a vertical cross-sectional side view of the control unit shown in FIG. 8.
Figure 10:
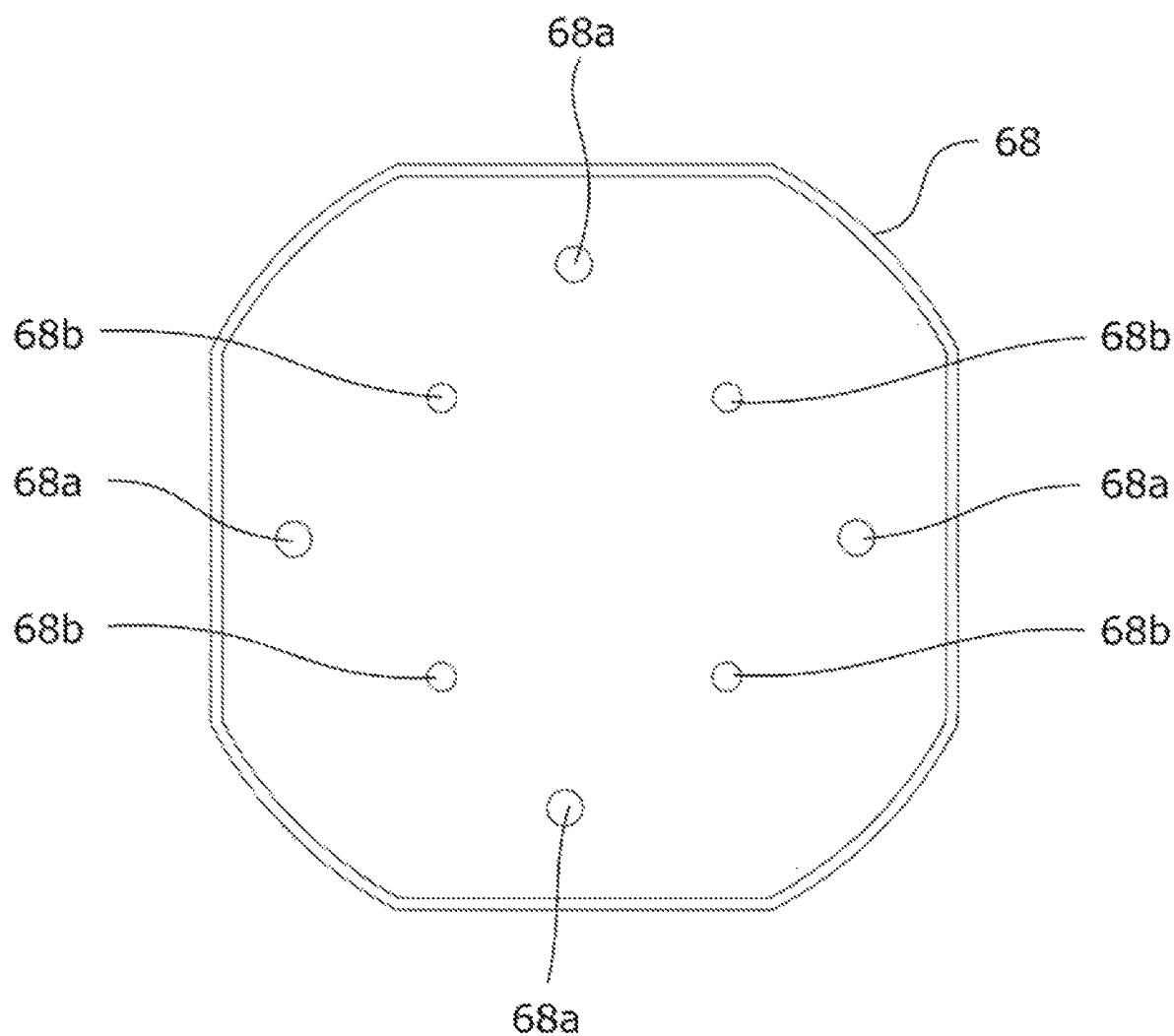
FIG. 10 is a plan view of a lid plate in the control unit shown in FIG. 9.

FIGS. 7 to 10 show a vacuum pump apparatus 50 in the second embodiment of the present invention. FIG. 7 is a side view of the vacuum pump apparatus 50. FIG. 8 is a side view of a control unit 52 in the vacuum pump apparatus 50 shown in FIG. 7. FIG. 9 is a vertical cross-sectional side view of the control unit 52 shown in FIG. 8. FIG. 10 is a plan view of a lid plate 68 in the control unit 52 shown in FIG. 9.

In FIG. 7, the vacuum pump apparatus 50 includes a pump main body unit 51 and a control unit 52 which controls the pump main body unit 51. In the vacuum pump apparatus 50, on a top surface portion 64 of the control unit 52, a plurality of spacers 53 (four spacers 53 in the second embodiment) are provided to control a weight of the pump main body unit 51 such that the weight of the pump main body unit 51 is transmitted to a ground contact surface, such as a floor surface, via each of spacers 53. Accordingly, in the control unit 52 of the vacuum pump apparatus 50, a strength of each of the spacers 53 to which the weight of the pump main body unit 51 is directly applied as a load is increased, while a strength of the other portion is conversely reduced. By thus increasing a strength of the entire control unit 52, a size and a weight of the entire control unit 52 is reduced to achieve a cost reduction.

First, a description will be given of a structure of the pump main body unit 51. The pump main body unit 51 has the casing 14 forming a housing of the pump main body unit 51. The casing 14 has a substantially cylindrical shape to form, together with a base 55 provided under the casing 14, a housing 56 of the pump main body unit 51. Note that, in the housing 56 of the pump main body unit 51, a gas transfer mechanism as a structure which causes the pump main body unit 51 to perform an exhausting function is contained, though not shown in the drawing. The gas transfer mechanism basically includes a rotary portion which is rotatably supported and a stationary portion which is fixed with respect to the housing of the pump main body unit 51.

In an upper end portion of the casing 14, the inlet port 17 for introducing a gas into the pump main body unit 51 is formed. Around an end surface of the casing 14 closer to the inlet port 17, the radially outwardly protruding flange portion 18 is formed.

In the base 55, the outlet port 19 for exhausting the gas from the pump main body unit 51 is formed.

Figure 11:
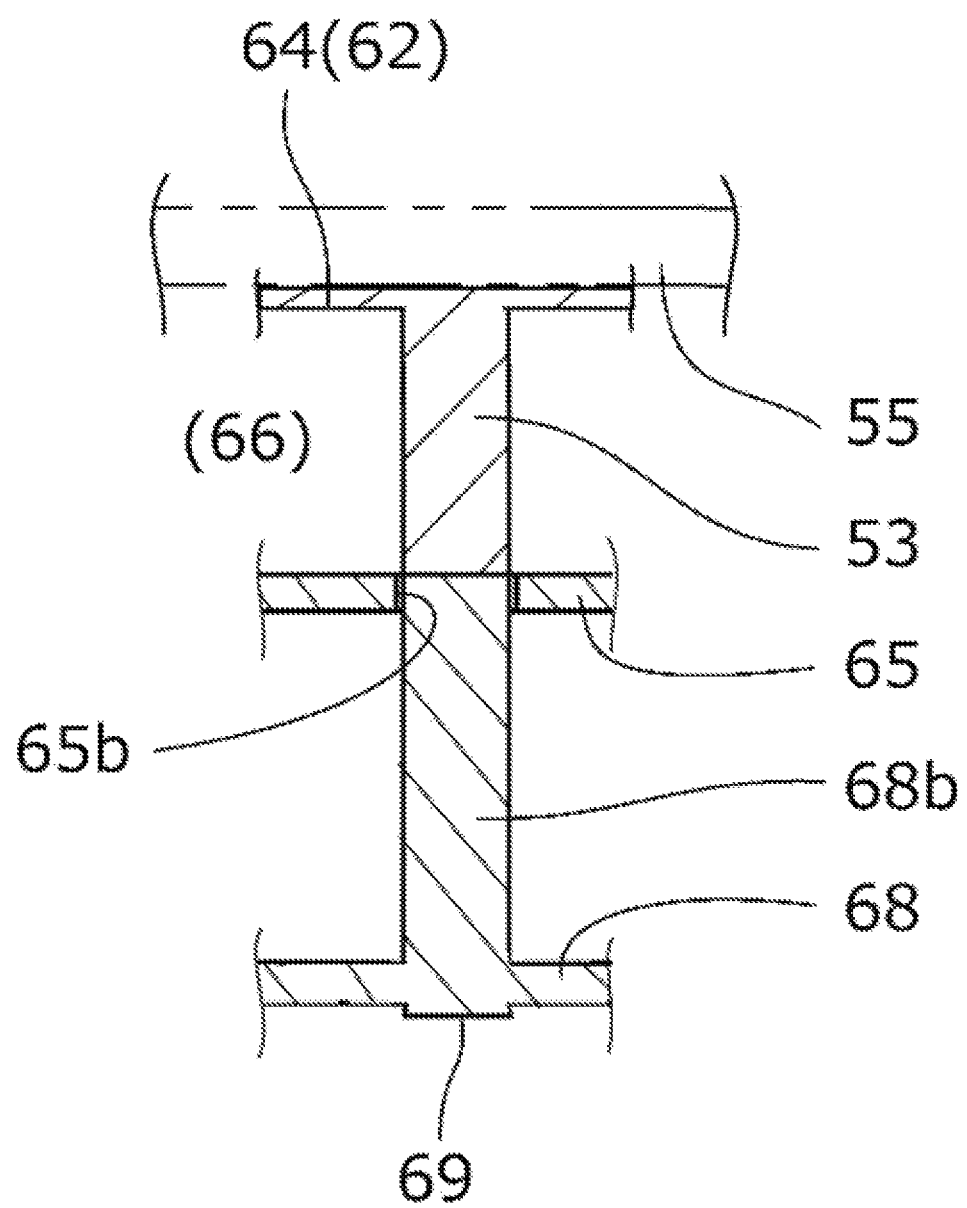
FIG. 11 is a schematic cross-sectional view illustrating a modification of the second embodiment.

Next, a description will be given of a structure of the control unit 52. The control unit 52 has a housing 62 as a casing of the control unit 52. As shown in FIGS. 9 to 11, the housing 62 integrally has side surface portions 63 each having a substantially rectangular shape and a top surface portion 64 closing an upper end (top surface) of the housing 62. The housing 62 has a lower surface having an opening (hereinafter referred to as the "upper surface opening") and an upper surface closed by the top surface portion 64, while having a space 66 provided therein. In the space 66, a circuit substrate 65 forming a control circuit which controls various operations of the pump main body unit 51 and the like are disposed. Note that the lower surface opening of the housing 62 is closed by a lid plate 68 to be openable/closable. In the second embodiment, each of the housing 62 and the lid plate 68 is made of die-cast aluminum.

The top surface portion 64 has the four pin-shaped spacers 53 formed integrally with the top surface portion 64. The spacers 53 are spaced apart from each other at predetermined intervals, while vertically hanging down from an inner surface of the top surface portion 64.

The lid plate 68 is removably attached to a lower surface of the housing 62 using fixation screws not shown. The lid plate 68 has a plurality of through holes 68a formed therein to correspond to the respective spacers 53 of the top surface portion 64, while having a plurality of boss portions 68b (four boss portions 68b in the second embodiment) formed thereon to support the circuit substrate 65 in the space 66.

Each of the through holes 68a is formed to have a size which allows the spacer 53 hanging down from the top surface portion 64 to extend therethrough. Each of the boss portions 68b is a pin-shaped boss protruding upward (toward the top surface portion 64) from an inner surface of the lid plate 68 and having an upper end surface on which the circuit substrate 65 is placed. The boss portions 68b are configured to be able to support the circuit substrate 65 from below and fix the circuit substrate 65 at a predetermined position in the space 66.

As shown in FIG. 9, in the circuit substrate 65, through holes 65a are formed at respective positions corresponding to the through holes 68a. Each of the through holes 65a has a size which allows the spacer 53 hanging down from the top surface portion 64 to extend therethrough.

When the vacuum pump apparatus 50 thus configured is used in a state where the pump main body unit 51 is placed over and integrated with the control unit 52, the vacuum pump apparatus 50 is assembled in accordance with a procedure as shown below in, e.g., (1) to (5).

(1), First, into the control unit 52, the circuit substrate 65 is incorporated to be held over the boss portions 68b of the lid plate 68.

(2) Then, the housing 62 is placed over the lid plate 68 from above. At this time, the spacers 53 extending from the inner surface of the top surface portion 64 of the housing 62 are inserted in and through the corresponding through holes 65a and 68a in succession to be positioned.

(3) Subsequently, the housing 62 and the lid body 68 are integrally turned over and fixed to each other using screws or the like. When the housing 62 and the lid plate 68 are thus fixed to each other using the screws or the like, the vacuum pump apparatus 50 is assembled with respective lower end portions of the individual spacers 53 slightly protruding from a lower surface of the lid plate 68. Note that the lower end portions of the spacers 53 protruding from the lower surface of the lid plate 68 serve as leg portions of the control unit 52.

(4) Then, the housing 62 and the lid plate 68 are integrally turned over again. Subsequently, respective positions of the housing 62 and the lid plate 68 which are integrated with each other are vertically inverted again to return a position of the control unit 52 to a correct position, as shown in FIG. 9. As a result, the control unit 52 is disposed on the floor surface in a state where the lower end portions of the individual spacers 53 protruding from the lower surface of the lid plate 68, i.e., the leg portions are grounded on the floor surface.

(5) Then, the pump main body unit 51 is placed over the control unit 52. In this case, a lower surface of the top surface portion 64 in the housing 56 of the control unit 52 has the plurality of spacers 53 formed integrally therewith. Consequently, each of the spacers 53 serves as a bracing member for reinforcing the top surface portion 64, and the pump main body unit 51 is disposed over the control unit 52 with the spacers 53 supporting the pump main body unit 51 from below. This prevents the top surface portion 64 from being easily deformed even when the weight of the pump main body unit 51 is applied to the top surface portion 64 of the control unit 52. Subsequently, when the pump main body unit 51 and the control unit 52 are connected using an electric cable not shown, the assembly of the vacuum pump apparatus 50 is completed.

Consequently, in the vacuum pump apparatus 50 in the second embodiment thus configured, the weight of the pump main body unit 51 is transmitted to the floor surface through the spacers 53 disposed between the housing (casing) 56 of the pump main body unit 51 and the housing 56 of the control unit 52. Specifically, the weight of the pump main body unit 51 is controlled to be received by each of the spacers 53. As a result, the housing 62 of the control unit 52 or the like is not required to have a particularly large strength. This can reduce the size and the weight of the pump main body unit 51, which contributes to a cost reduction. Moreover, in this case, between the housing (casing) 56 of the pump main body unit 51 and the housing 62 of the control unit 52, the gap σ provided in the first embodiment is not present. This allows the pump main body unit 51 and the control unit 52 to be disposed in a state where the lower surface of the pump main body unit 51 is in close contact with the upper surface of the control unit 52.

The spacers 53 need not necessarily be directly grounded. For example, as shown in FIG. 11, it may also be possible to cause the spacers 53 to be opposed to at least one or more boss portions 68b upwardly extending (toward the top surface portion 64) from the inner surface of the lid plate 68, bring the spacers 53 into contact with the boss portions 68b, and allow the weight of the pump main body unit 51 to be received by the floor surface through the spacers 53 and the boss portions 68b. In this case, it is preferred that, in the circuit substrate 65, through holes 65b through which the boss portions 68b are to extend are provided and, on the back surface of the lid plate 68 corresponding to the boss portions 68b, protruding leg portions 69 are provided to be grounded on the floor surface.

Each of the foregoing embodiments has described the case where the pump main body unit 11 or 51 and the control unit 12 or 52 are vertically disposed, i.e., the case where the pump main body unit 11 or 51 is disposed over the control unit 12 or 52. However, even when the pump main body unit 11 or 51 and the control unit 12 or 52 are arranged laterally to each other and the spacers 13 or 53 of the control unit 12 or 52 are disposed at approximately right angles to the pump main body unit 11 or 51 to provide a horizontal layout, the same effects are obtainable. Specifically, in the case of such a horizontal layout, when, e.g., the pump main body unit 11 or 51 and the control unit 12 or 52 shake together and the weight is applied from the pump main body unit 11 or 51 to the control unit 12 or 52, the spacers can receive and thus control the weight from the pump main body unit 11 or 51. As a result, the housing 62 of the control unit 52 or the like is not required to have a particularly large strength.

Not only when the weight is applied from the pump main body unit 11 or 51 to the control unit 12 or 52, but also when a load is applied to the control unit 12 or 52 from the outside, the spacers can receive the load. Consequently, it is possible to reduce deformation of the housing 62 or the like without significantly increasing the strength of the housing 62 of the control unit 12 or 52 or the like.

Note that each of the embodiments and modification of the present invention may also be configured to be combined with each other as necessary.

Various modifications can be made to the present invention without departing from the spirit of the present invention. It should be clearly understood that the present invention is intended to encompass such modifications.

Although elements have been shown or described as separate embodiments above, portions of each embodiment may be combined with all or part of other embodiments described above.

Although the subject matter has been described in language specific to structural features and/or methodological acts, it is to be understood that the subject matter defined in the appended claims is not necessarily limited to the specific features or acts described above. Rather, the specific features and acts described above are described as example forms of implementing the claims.

What is claimed is:

1. A vacuum pump apparatus comprising:
   a housing of a pump main body unit;
   a housing of a control unit; and
   a plurality of spacers coupled to the housing of the control unit to support a load applied to the housing of the control unit, wherein
   the housing of the pump main body unit is placed on upper surfaces of the plurality of spacers,
   the housing of the control unit provides a plurality of recessed portions on side surface portions of the housing of the control unit,
   the plurality of spacers are disposed on bottom surfaces of the corresponding recessed portions.

2. The vacuum pump apparatus according to claim 1, wherein the plurality of spacers form a predetermined gap between the pump main body unit and the control unit.

3. The vacuum pump apparatus according to claim 1, wherein the housing of the pump main body unit is above the housing of the control unit and the plurality of spacers extend from the housing of the control unit toward the housing of the pump main body unit and are spaced apart from each other at a predetermined interval.

4. The vacuum pump apparatus according to claim 1, wherein a second plurality of spacers are disposed in a space within the housing of the control unit.

5. The vacuum pump apparatus according to claim 1, wherein, on a lower surface of the housing of the control unit, a leg portion capable of being grounded on a floor surface is provided to correspond to the plurality of spacers.

6. The vacuum pump apparatus according to claim 4, wherein lower end portions of the second plurality of spacers extend through the housing of the control unit and protrude from the housing of the control unit.

7. The vacuum pump apparatus according to claim 4, wherein the housing of the control unit has a boss portion protruding from a bottom surface of the housing of the control unit toward a top surface of the housing of the control unit, the boss portion being provided in opposing relation to and in contact with at least one of the second plurality of spacers.

* * * * *